United States Patent [19]

Hag

[11] Patent Number: 5,150,330
[45] Date of Patent: Sep. 22, 1992

[54] INTERBLOCK DISPERSED-WORD MEMORY ARCHITECTURE

[75] Inventor: Ejaz U. Hag, Sunnyvale, Calif.

[73] Assignee: VLSI Technology, Inc., San Jose, Calif.

[21] Appl. No.: 722,586

[22] Filed: Jun. 27, 1991

Related U.S. Application Data

[63] Continuation of Ser. No. 469,617, Jan. 24, 1990, abandoned.

[51] Int. Cl.$^5$ .......................... G11C 7/00; G11C 5/02
[52] U.S. Cl. ................................ 365/230.03; 365/51; 365/63
[58] Field of Search ...................... 365/51, 63, 230.03, 365/230.06, 238.1, 238.5; 357/45

[56] References Cited

U.S. PATENT DOCUMENTS

| | | | |
|---|---|---|---|
| 4,675,849 | 6/1987 | Kinoshita | 365/230.03 |
| 4,691,298 | 9/1987 | Fukuda et al. | 365/230.03 |
| 4,789,967 | 12/1988 | Liou et al. | 365/230.03 |
| 4,817,057 | 3/1989 | Kondo et al. | 365/230.03 |

OTHER PUBLICATIONS

Furlow, Bill, "Caching Catches a Ride on 32-bit Designs", *ESD: The Electronic Systems Design Magazine*, May, 1989, pp. 36–44.

Tuljapurkar, Shubha, "Integrated Cache Subsystems", *ESD: The Electronic Systems Design Magazine*, May 1989, p. 42. (Note: this is included in the previous article).

Hiroaki Okuyama et al., "A 7.5ns 32K×8 CMOS SRAM" *IEEE Journal of Solid–State Circuits*, vol. 23, No. 5, Oct. 1988, pp.1054–1059.

Yoshio Kohno et al., "A 14-ns 1-Mbit CMOS SRAM with Variable Bit Organization" *IEEE Journal of Solid–State Circuits*, vol. 23, No. 5, Oct. 1988, pp. 1060–1066.

Katsuro Sasaki et al., "A 15-ns 1-Mbit CMOS SRAM" *IEEE Journal of Solid–State Circuits*, vol. 23, No. 5, Oct. 1988, pp. 1067–1072.

Wong et al., "A 11-ns 8K×18 CMOS Static RAM with 0.5-μm Devices" *IEEE Journal of Solid–State Circuits*, vol. 23, No. 5, Oct. 1988, p. 1101.

*Primary Examiner*—Terrell W. Fears
*Assistant Examiner*—Jack A. Lane
*Attorney, Agent, or Firm*—Clifton L. Anderson

[57] ABSTRACT

A static random access memory (SRAM) employs a modified divided word architecture in which each address selects cells from plural blocks. Thus, each word is dispersed among multiple blocks, rather than being confined to a single block as in conventional divided word architectures. More specifically, the blocks are divided among four quadrants of the array and data pads (or ports) are arranged on opposite sides of the array. This architecture causes each word to be divided among all four quadrants. Each quadrant is coupled via a respective data bus to the data ports adjacent to the quadrant. This arrangement reduces data path lengths within the SRAM, improving overall access times.

10 Claims, 3 Drawing Sheets

INTERBLOCK DISPERSED-WORD MEMORY ARCHITECTURE

This is a continuation of application Ser. No. 07/469,617 filed Jan. 24, 1990 and now abandoned

BACKGROUND OF THE INVENTION

The present invention relates to electronics and, more particularly, integrated circuit memory devices. A major objective of the present invention is to provide an address architecture for faster high-density memory devices.

Much of recent technological progress has been tied to advances in integrated circuits. Memory devices are by far the most numerous of these integrated circuits and advances in their density and speed have led much of the modern revolution in electronics. The advances in electronic memories are surpassed, however, by an increasing demand for denser and faster memories.

Among the fastest integrated circuit memories are static random access memories (SRAMs), so named because they avoid the requirement of a refresh cycle used in the generally denser, but slower, dynamic random access memories (DRAMs). SRAMs typically include a two-dimensional array of memory cells arranged in rows and columns. Each cell is capable of storing one bit of information. Communication between a memory chip and an external device, such as a microprocessor, takes place via input/output (I/O) data ports on the memory device. The number of data ports on the device limits the number of cells which can be accessed at any given time. For purposes herein, the number of data ports defines the "word" size of the memory. For example, a 16-bit wide memory typically would include sixteen data ports.

When a cell is electrically coupled to a data port, the contents of the cell can be read out of the port or the cell can be forced to store a data value as dictated by a data input to the port. A major design consideration for a memory device is the method of selecting which cells are to be read or written to at any given time. Cell selection is referred to as addressing. A memory device includes address inputs which collectively accept an address code. Each of a large number of possible address codes selects a group of cells for coupling to the data ports. The number of cells in the group is typically the word size, so that all data ports are used, and the collective contents of cells so selected constitute a data word.

The earliest SRAMs employed a relatively simple address scheme in which each word was stored in consecutive cells in a single row of an array of cells. For example, a 4K SRAM could comprise a 64×64 array of cells. An eight-bit word would be selected by activating any of sixty-four rows and exactly one of the following eight groups of columns: 1-8, 9-16, 17-24, 25-32, 33-40, 41-48, 49-56, and 57-64. A differential sense amplifier is required for each cell to be read. One sense amplifier per column is sufficient for this function, since only one row is addressed at any given time. One problem with this approach is that sense amplifiers are larger than cells so that providing one sense amplifier per column limits the number of columns to the pitch of the sense amplifiers.

To provide for greater memory cell densities, a different architecture was required in which one sense amplifier serviced multiple columns. Multiplexing of columns to sense amplifiers is typically effected using transmission or pass gates to turn columns on or off. Since, in the original memory scheme, adjacent columns held bits of the same word, each sense amplifier had to be connected on a staggered basis to columns. For example, a first sense amplifier would be connected to columns 1, 9, 17, 25, etc., while a second sense amplifier would be connected to columns 2, 10, 18, 26, etc., and so on for six more sense amplifiers. The routing for this arrangement was problematic, requiring numerous bit line crossings.

To simplify routing to sense amplifiers, words were dispersed columnwise. For example, the eight-bit word corresponding to a particular address input would be stored in row 5, columns 3, 11, 19, 27, 35, 43, 51 and 59. Columns 1-8 could all be tied to a first sense amplifier, since no address would require two of these eight columns to be read at once. Thus, by staggering the cells corresponding to words, a memory with a reduced number of sense amplifiers and simplified routings was obtained.

With the assignment of sense amplifiers to multiple columns and the attainment of simplified routing of columns to sense amplifiers, improvements in semiconductor processing permitted increased numbers of cells per device. Megabit devices and greater have been developed. Concurrently, faster microprocessors have been developed, so that the speed at which information could be transferred in and out of these large memory devices has become a primary issue.

One of the limits on access speed proved to be noise during addressing cells. In particular, the word lines used to select the row of a selected word were subject to noise as they were activated. The noise was correlated with the number of cells tied to the word line. In a 1-megabit SRAM, for example, a row can consist of 1024 (1K) cells, which would require a significant current to be switched at once. To avoid the errors that the noise associated with switching 1 K cells could induce, the switching had to be done slowly or else reading or writing had to wait until the undesirable transients had settled.

A "divided word line" architecture was developed to deal with the problem of word line noise. Instead of having only one word line per row, multiple subword lines would be used for each row. The array of cells would be divided into blocks of contiguous cells. Each row of each block would have its own subword line. A main word line would convey address information to local decoders which would control the subword lines for each block. By dividing an array into four blocks, each subword line would be connected to only one-fourth of the cells in a row, decreasing the problem with noise and therefore increasing the access time for the device.

The divided word line approach can be extended to apply to columns as well as rows to reduce noise on bit lines. Thus, a two-dimensional array of blocks can be used to reduce the number of cells on individual bit and word lines. Data words are then allocated to blocks so that each block functions like a smaller memory. Each block requires a full complement of sense amplifiers and, thus, each data port is couplable to one sense amplifier of each block. Multiplexing of sense amplifiers to data ports can be effected by enabling and disabling sense amplifiers. The divided word line approach can be extended by increasing the number of blocks at the expense of increased addressing complexity. However, as a result of the advances provided by the divided word line approach, addressing speed is no longer the primary limitation in memory access speed. Accordingly, the divided word line approach is nearing a point of diminishing returns.

Further increases in memory access speed are clearly desired. The challenge is to identify the factors, other than address time, that continue to limit access speed and determine approaches that can be used to overcome these factors.

SUMMARY OF THE INVENTION

In accordance with the present invention, it has been determined that a significant limitation in the access time of memory devices is the data path length between a cell and the data port to which it is couplable. The data path length is roughly equal to the sum of the bit line length of a cell to its sense amplifier plus the data line length of the sense amplifier to the data port. To minimize the maximum data path length in the context of a block or divided word line architecture, the cells corresponding to the bits of a word are dispersed among blocks. Blocks are then associated with only a subset of the data ports and this association is on a proximity basis to minimize cell to port distances.

In a simple realization of the present invention, a divided word line architecture divides a cell array into left and right blocks (dividing rows into subrows, but keeping columns full length). Half of the data ports are couplable to the left block and the other half are couplable to the right block. Each addressable word is distributed between the left and right blocks.

In an alternative realization, four blocks are arranged linearly left to right. Each word is distributed either between the first and third blocks or between the second and fourth blocks. The first and second blocks are multiplexed to one set of data ports and the third and fourth blocks are multiplexed to the remaining data ports. In this scheme, only some blocks are activated for a given address.

By dividing an array in two-dimensions, further realizations are achieved. For example, a cell array can be divided into quadrants and data ports can be arranged on two sides of the array. Each array quadrant can serve as a single block and each addressable word can contain bits in each quadrant. Preferably, each quadrant can contain two or more blocks, one block of each quadrant being activated per received address. Each cell is couplable only to data ports adjacent to the quadrant containing the cell to minimize data path lengths.

The present invention provides for advances in specific memory designs, for example for set associative caches and caches designed for both instructions and data. Rather than separating two categories of data into separate blocks, as is done conventionally, the two types can be interleaved, preserving the data path length advantages of the present invention.

The present invention is motivated by the recognition of the importance of data path lengths in limiting memory access times in high density memory devices. While the conventional block approach reduces the access times by reducing word and bit line noise, this gain is partially offset by increases in mean data path lengths. With decreasing feature dimensions, the data path lengths become important sources of resistance and capacitance, limiting signal transition times. Addressing times become less critical because larger address currents can be supplied with decreasing feature sizes.

Accordingly, the present invention achieves faster memory devices by decreasing data path lengths at the expense of a less significant increase in addressing complexity. The increased complexity of address decoding is itself somewhat offset by the reduction in multiplexing between sense amplifiers and data ports. These and other features and advantages of the present invention are apparent from the description below with reference to the following drawings.

DESCRIPTION OF THE PREFERRED EMBODIMENTS

Figure 1:
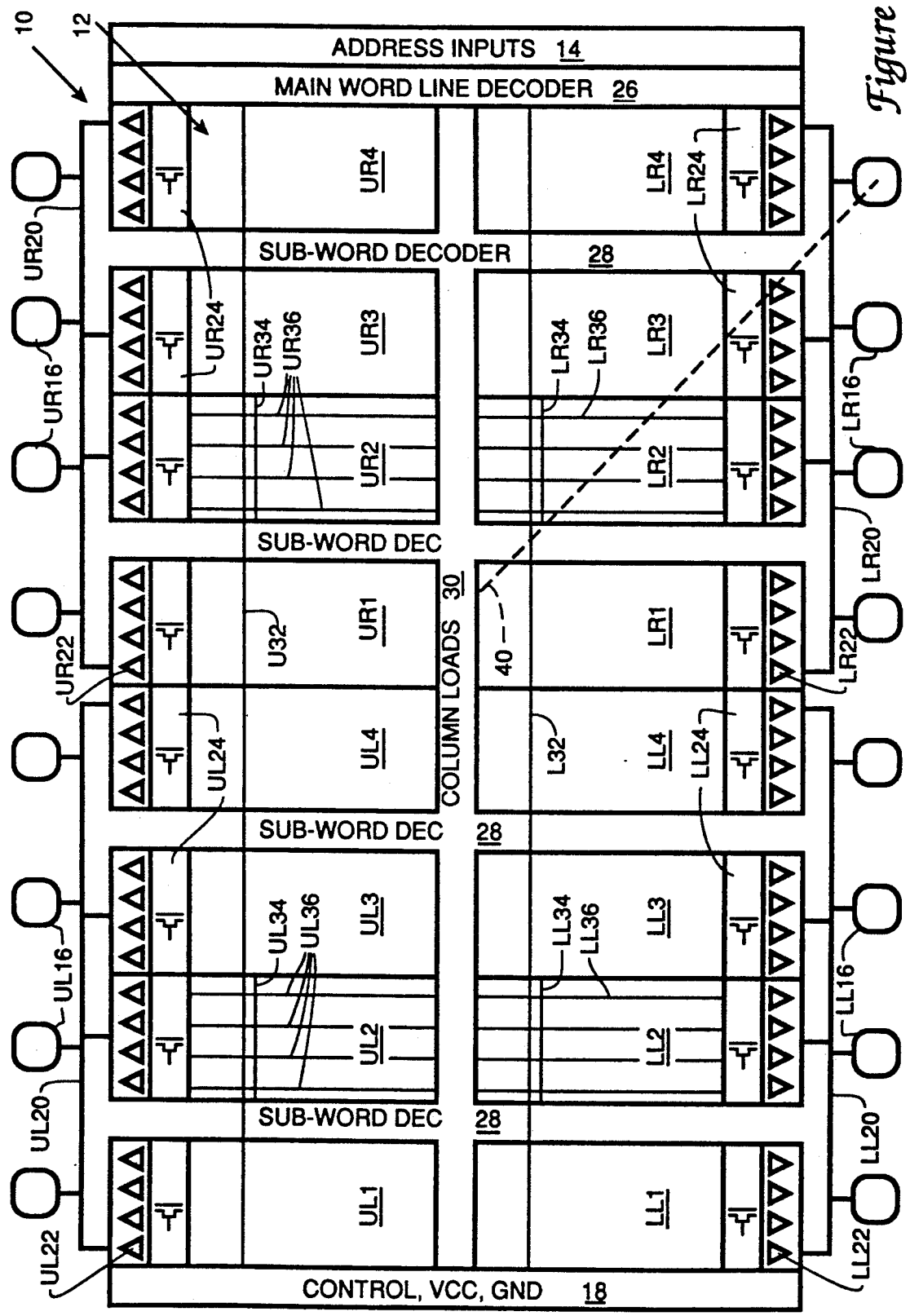
FIG. 1 is a schematic of an SRAM memory device in accordance with the present invention.

In accordance with the present invention, an SRAM 10 includes an array 12 of memory cells, address inputs 14, data ports UL16, UR16, LL16 and LR16, other ports 18 including control, power (VCC) and ground (GND), data busses UL20, UR20, LL20, LR20, sense amplifiers UL22, UR22, LL22 and LR22, pass gates UL24, UR24, LL24 and LR24, a main word line line decoder 26, sub-word decoders 28, and column decoders and loads 30, as shown in FIG. 1. SRAM 10 implements a modified divided word architecture in which array 12 is divided into 16 blocks UL1-4, UR1-4, LL1-4 and LR1-4. Blocks UL1-4 are in an upper left quadrant of array 12, blocks UR1-4 are in an upper right quadrant, LL1-4 are in a lower left quadrant and LR1-4 are in a lower right quadrant.

The overall dimension of array 12 is 256 by 512 cells which provides for 128 k bits of storage. The sixteen data ports permit sixteen bits to be accessed with a single address so that the SRAM 10 is configured as an 8K by 16 memory. Each block is 64 by 128 bits.

Each address received at address inputs 14 provides the 13 bits of information required to select among 8 k words stored in array 12. Seven of the address bits are decoded by main word line decoder 26 to select 1 of 128 main word lines in the upper half of array 12, the selection being duplicated for the lower half of array 12. For example, two word lines U32 and L32 are shown activated in FIG. 1. Two address bits are further decoded by sub-word line decoders, otherwise termed block decoders, to select one block of four in each quadrant for sub-word line activation; the selection is replicated in all quadrants. In FIG. 1, subword lines UL34, UR34, LL34 and LR34 are shown activated concurrently. Preferably, the sub-word decoding is duplicated to enable only four of sixteen sense amplifiers UL22, UR22, LL22, LR22 in each quadrant to minimize noise and power dissipation during each access.

The remaining four bits of address are used to select one of 16 possible column combinations within a selected block. The four most significant bits of each word stored in array 12 are stored in the upper left quadrant. The four most significant bits of a word at a given address are within the same block. The second four most significant bits are stored in the corresponding block in the upper right quadrant. The third four most significant bits are stored in the corresponding block in the lower left quadrant. The four least significant bits are stored in the corresponding block in the lower right quadrant. Thus four bits of each word are stored in each quadrant.

Since the four most significant bits of an addressed word are stored along a single sub-word line, in other words, within a single row, sixteen words are represented in each row of each block. Four address bits are required to select among these sixteen words. The selection determines the four columns for the selected cells, and this selection is replicated in each quadrant. In FIG. 1, activated column lines are indicated at UL36, UR36, LL36 and LR36. Since, SRAM cells are read differentially, each illustrated column line corresponds to a true/false bit line pair and eight pass gates per quadrant must be activated. The intersection of subword line UL34 with column lines UL36 represent the cells holding the four most significant bits of the word being read in FIG. 1. The remaining cells being read are represented at comparable intersections with the other three quadrants.

Each quadrant of array 12 is associated with four data ports arranged adjacent to the quadrant. The four blocks of a quadrant are coupled by a respective four-bit data bus to the associated four data ports. Specifically, data ports UL16 are coupled to blocks UL-4 by data bus UL20, data ports UR16 are coupled to blocks UR1-4 by bus UR20, data ports LL16 are coupled to blocks LL1-4 via data bus LL20, and data ports LR16 are coupled to blocks LR1-4 via data bus LR20. Each block has four sense amplifiers, each of which is coupled by the connected data bus to a respective one of the four associated data ports. Accordingly, each bit of each word has a path through an associated data port.

SRAM 10 shares the advantages of conventional divided word line architectures in that subword lines are connected to a relatively few cells at a time, e.g., 64 of 512 cells in a row. There is some penalty relative to conventional divided word line architectures in that word line decoding must be duplicated and sub-word decoding must be replicated three times. However, the area penalty is small due to the small size and small number of address logic components.

Any costs in implementing the architecture of SRAM 10 are more than offset by reductions in data path lengths. Data path lengths are approximately the sum of the bit line length from a cell to a respective sense amplifier and a data line length from the sense amplifier to the respective data port. By arranging data ports on two sides of array 12, mean bit line lengths are reduced 50% relative to SRAMs with data ports on only one side of the array. By distributing a word to all four quadrants, data line lengths are kept below one half the width of the device.

Line 40 illustrated a maximal straight line data path length for SRAM 10. The straight line length is the hypotenuse of the right angle defined by the bit line length and the data line length and thus serves as a proportional representation of data path length. One end of line 40 is connected to the corner data port of data ports LR16. The other end of line 40 is at the most remote cell of those that communicate through the corner data port. This cell is the least significant bit of the first word of the first row of block LR1. Each corner data port has an associated cell a comparable distance away, but none has an assoicated cell significantly further away.

Figure 2:
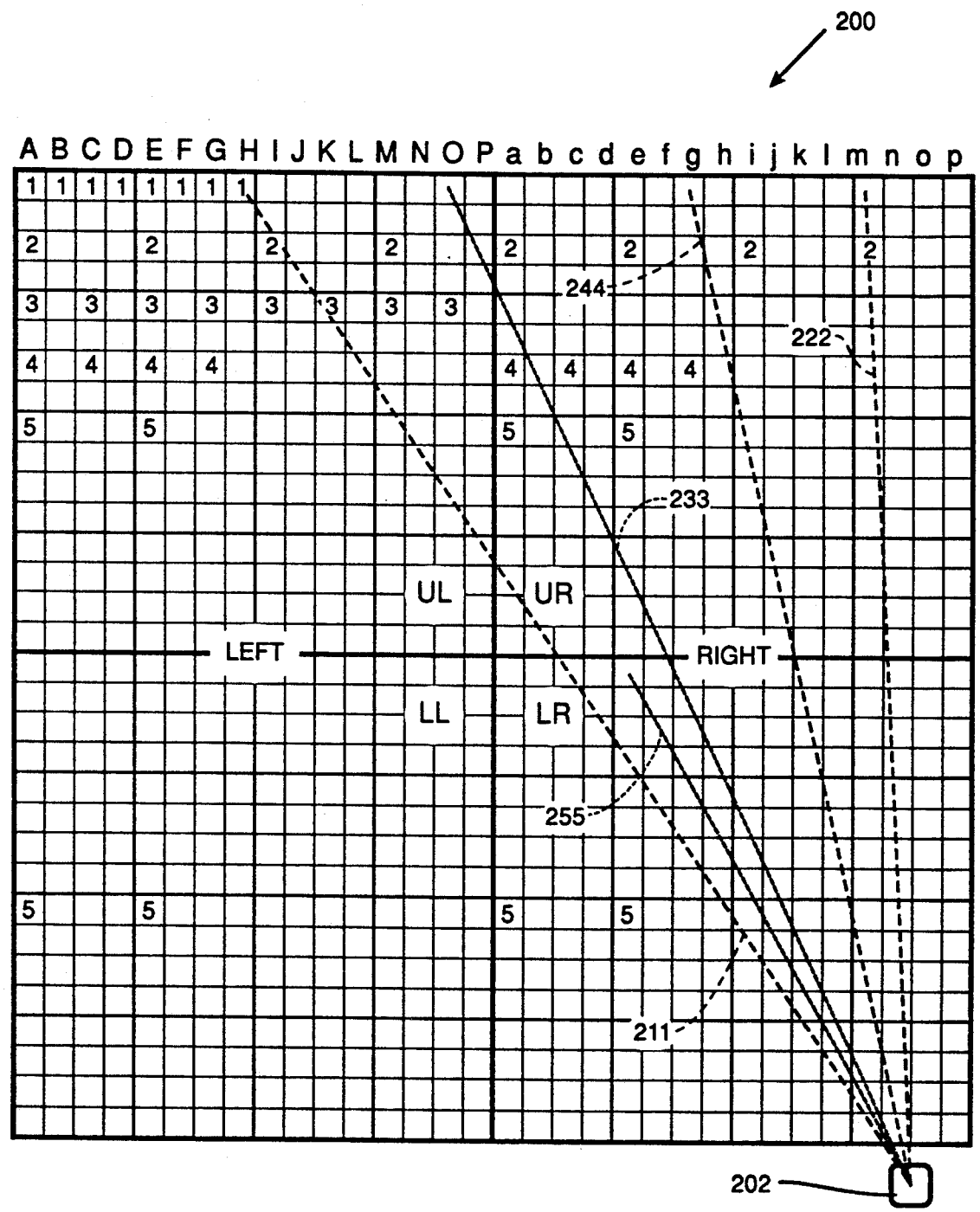
FIG. 2 is a schematic of a memory array illustrating the word distribution of the present invention.

The advantages of the present invention is reducing bit-line length are examined further with reference to FIG. 2 which depicts an array 200 and a corner data port 202. Array 200 is a 32×32 bit array. A series of eight 1s are positioned in the cells of the first row in columns A-H. These eight ones represent the bits of an eight-bit word stored in the most primitive memory architecture, i.e., words stored in consecutive cells and no divided word line addressing. The maximal data path length is indicated by hypothenuse 211, which is shown to be the longest maximum data path of any of the architectures discussed herein. As discussed above, the problem with this arrangement was not the data path lengths, but the routing problems.

The routing problems are reduced in the single-block architecture in which words were dispersed in a single row, as indicated by the 2s in the third row at columns A, E, I, M, a, e, i, and m. In addition to reducing routing problems, the maximum data path length was improved as indicated by comparing hypotenuse 222 with hypotenuse 211. Hypotenuse 222 extends from the least significant bit of the first word stored in the first row of array 200 to data port 202.

As indicated above, the single-block architectures were burdened by the number of cells attached to each word line. This problem was addressed by divided word line architectures. A simple divided word line architecture divides array 200 into two blocks, a first block LEFT defined by columns A-P, and a second block RIGHT by columns a-p. Each address causes a subword line in exactly one of these blocks to be activated, all subword lines in the non-selected block remain inactive. Each word is stored on a staggered basis within each row of each block. In effect, the divided word line architecture converts a 32×32 array into a 64×16 array so that 64 subword lines are each connected to sixteen cells. The 3s in the fifth row and columns A, C, E, G, I, K, M and O show the word distribution in this architecture. Hypotenuse 233 indicates the maximal data path length from the least significant bit of the first word of the first row to data port 202.

The 4s in the seventh row and columns A, C, E, G, a, c, e, and g represent a word distribution in accordance with a second architecture in accordance with the present invention. This architecture uses a divided word line approach to define four blocks, a first having columns A-H, a second having columns I-P, a third having columns a-h, and a fourth having columns i-p. A given address addresses either both the first and third blocks or the second and fourth blocks, but not both pairs at once. Each divided word line addresses eight cells. Two divided word lines are activated for each address. In this architecture, all data ports are along the bottom of array 200. Hypotenuse 244 extends from the least significant bit of the first word of row one to data port 202. Note that the improvement in data path length is relative to the conventional divided line architecture shown by hypotenuse 233.

A word dispersion more closely corresponding to the architecture of SRAM 10 is indicated by the eight 5s distributed among four quadrants UL, UR, LL and LR. The two most significant bits of the illustrated word are stored in quadrant UL in the ninth row at columns A and E. The remaining bits are stored in corresponding locations in the other three quadrants. Hypotenuse 255 assumes that data ports are arranged both above and below array 200. Note that hypotenuse 255 represents a dramatic reduction in data path length over the other illustrated data arrangements. Each address causes four divided word lines to be activated, one in each quadrant. Each quadrant includes two blocks, one of which is activated for a given address, the other of which remains inactivated.

The approach of the present invention has important implications for cache memories in which the information stored within is categorized. This occurs in set associative caches when data from main memory is brought into a cache in data blocks. A set associative cache can provide for two, three, four or more of these data blocks. Alternatively, some caches are assigned double duty as data and instruction caches. In conventional architectures, the distinct data blocks are assigned to respective physical blocks of the cache memory array. The present invention provides for interleaving data blocks within array blocks. Thus, every array block of a cache memory would include both data and instructions. The data and instructions can be interleaved row-by-row, or grouped in two or more subblocks within each block. In set associative memories, each array block would hold data from all data blocks. The advantage is, once again, reduction of maximal data path lengths.

Figure 3:
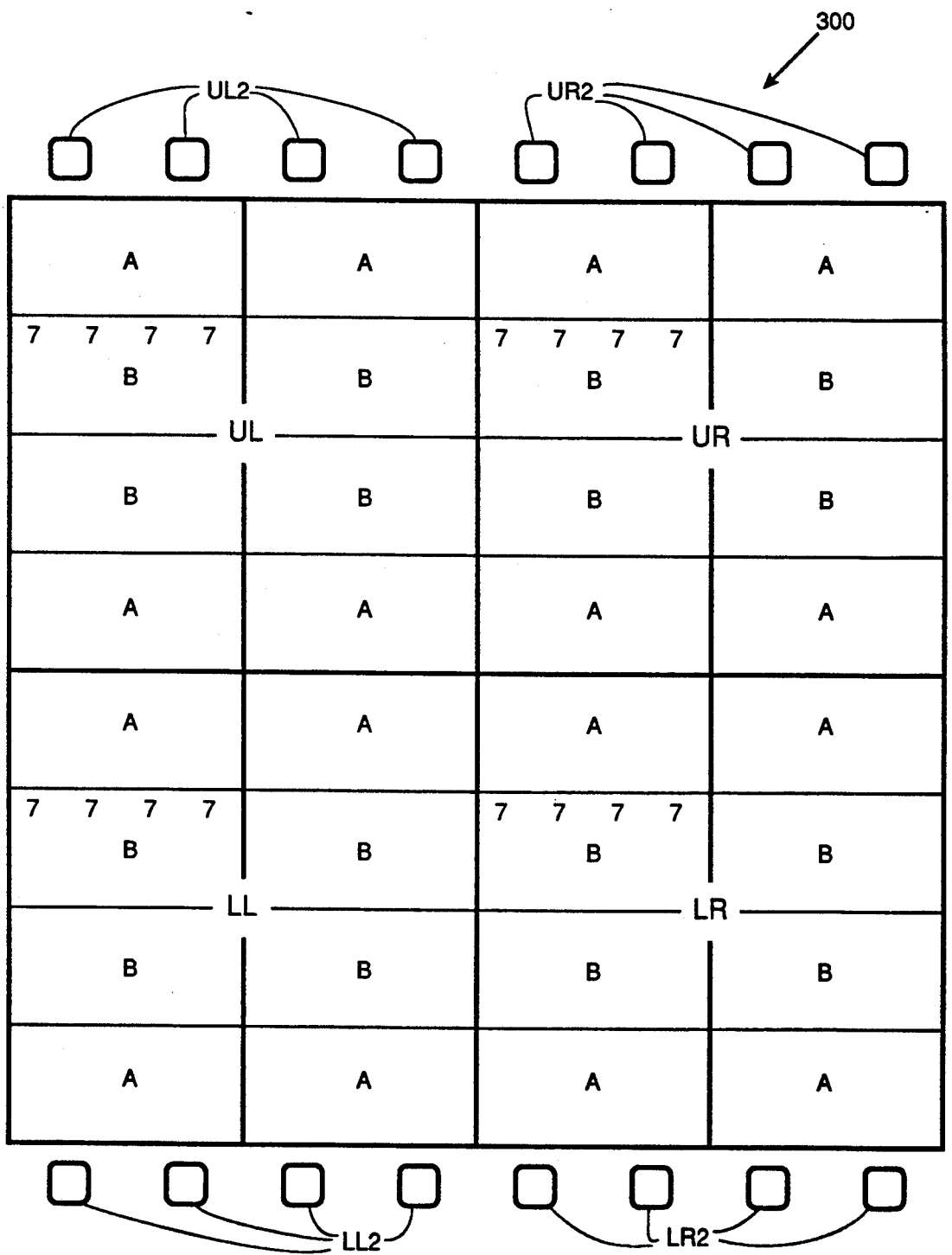
FIG. 3 is a schematic of a set-associative memory array in accordance with the present invention.

Memory 300 in FIG. 3 is shown with four quadrants, each with left and right blocks. Each block includes four subblocks, two of which are labelled A and two of which are labelled B. Subblocks labelled A contain data associated with a first set of cache data, while subblocks B contain data associated with a second set of cache data. Data for quadrant UL is communicated through data ports UL2, data for cells in quadrant UR is communicated through data ports UR2, data for cells of quadrant LL is communicated through data ports LL2 and data for cells of quadrant LR is communicated through data ports LR2. The sixteen 7s show this distribution of a single word through all four quadrants. In a conventional set associative cache, A blocks would be arranged on the left side of a memory and all B blocks would be arranged on the right side. The arrangement of memory 300 provides shorter maximal data path lengths and, thus, faster, access times. Note that the contents of blocks A and B can be data and instructions, respectively, as well as different data blocks, depending on the application of memory 300.

The present invention provides for additional embodiments in which the blocks constitute a one-dimensional array or a two-dimensional array. A word can be dispersed to all blocks or to only some of the blocks. A word can be distributed among two or more blocks and one or more bits per block to which it is distributed among. Two-dimensional block arrays preferably have data ports on two sides of the array and words dispersed among all four quadrants. Data ports can also be distributed along three or four sides of an array, and more sides of non-rectangular cell arrays. Two-dimensional arrays can include two or more blocks per column. For example, a three-by-three array of blocks might include data ports on four sides. In addition, flip-chip arrangements permit data ports away from the periphery of a device so that a 3×3 block array could include a central data port. In all cases, assignment of cells to data ports is on a proximity basis within the constraints of the addressing scheme.

These and other modifications to and variations upon the preferred embodiments are provided for by the present invention, the scope of which is limited only by the following claims.

I claim:

1. A memory device comprising:

an array of memory cells arranged in cell rows and cell columns and arranged in blocks of contiguous ones of said cells, said array including a plurality of subrows, each of said subrows being an intersection between one of said blocks and one of said cell rows, each of said subrows including a plurality of said cells;

data ports providing for communication between said cells and a host system;

addressing inputs for receiving address codes for selecting respective sets of said cells for coupling with said data ports, each of said sets containing all of said cells coupled to said data ports in response to a respective address code, the cells of each set that are within the same row being dispersed within said row and among a plurality of said blocks, each cell of a selected set being coupled to a respective one of said data ports, each of said subrows including cells from a plurality of mutually exclusive ones of said sets; and address decoding means for decoding each of said address codes in accordance with a divided word line architecture including main word line decoding means, subword line decoding means and column decoding means, said subword line decoding means including plural subword lines, each of said subword lines being arranged to activate all of said cells in a respective one of said subrows, said column decoding means causing at least some cells in each activated subrow to remain decoupled from said data ports, said address decoding means providing for the activation of a plurality of said subword lines in response to each received address code so that not all cells coupled to said data ports lie within the same of said blocks.

2. A memory device as received in claim 1 wherein, in response to a given address code, only some of said blocks contain cells coupled to said data ports.

3. A memory device as recited in claim 1 wherein said blocks define a two-dimensional array of block rows and block columns, said address decoding means activating at least two of said subword lines associated with respective subrows in different block rows in response to an address code.

4. A memory device as recited in claim 3 wherein said data ports are arranged along at least two sides of said array.

5. A memory device comprising:

an array of memory cells arranged in rows and columns;

address inputs for receiving address codes for selecting respective sets of said cells, each of said sets containing all of said cells coupled to said data ports in response to a respective address code, each of said sets containing at least two cells located in different rows;

data ports for communicating data; and address decoding means for coupling each of said data ports to a respective one of said cells as a function of said respective address code, said address decoding means defining a divided-word-line architecture that divides said array into a plurality of blocks of contiguous subrows, each of said subrows containing cells belonging to a plurality of mutually exclusive ones of said sets, said address decoding means coupling at least one of said data ports to a cell in a first of said blocks and, concurrently, coupling at least one other of said data ports to a cell in a second of said blocks;

whereby, a word corresponding to a given address code is stored in cells distributed among plural blocks.

6. In a memory device employing a divided-word-line architecture, said memory device comprising:

an array of memory cells arranged in cell rows and cell columns and arranged in blocks of contiguous ones of said cells, said array including a plurality of subrows, each of said subrows being an intersection between one of said blocks and one of said cell rows, each of said subrows including a plurality of said cells;

data ports providing for communication between said cells and a host system;

addressing inputs for receiving address codes for selecting respective words of said cells for coupling with said data ports, each of said words containing all of said cells coupled to said data ports in response to a respective address code; and address decoding means for decoding each of said address codes in accordance with said divided-word-line architecture including main-word-line decoding means, subword-line decoding means and column decoding means, said subword line decoding means including plural subword lines, each of said subword lines being arranged to activate all of said cells in a respective one of said subrows, said column decoding means causing at least some cells in each activated subrow to remain decoupled from said data ports, said address decoding means coupling each of said data ports to a respective cell in each of said words, the improvement wherein:

the cells of each of said words are dispersed;

the cells of each of said words are distributed among a plurality of blocks;

said address decoding means provides for the activation of a plurality of said subword lines in response to each received address code so each of the cells of a word is coupled to its respective data port in response to the respective received address code; and said column decoding means causes at least one intermediate cell to remain decoupled in response to said received address code, said intermediate cell not being a cell of the respective word, said intermediate cell being in the same subrow as a first cell of said respective word, said intermediate cell being between said first cell and a second cell of said respective word, said second cell being in the same row as said first cell, said first and second cells being in different subrows.

7. An improvement in a memory device as recited in claim 6 wherein said cells of said words are dispersed so that the maximum distance between any cell of any of said words and its respective data port is less than the maximum distance between any cell of any word and its respective data port for any memory device having the same array dimensions and arrangement of data ports but having the cells of each word are arranged consecutively within a single row.

8. An improvement in a memory device as recited in claim 6 wherein the cells of each of said words are distributed between plural rows.

9. An improvement in a memory device as recited in claim 6 wherein said array is configured in quadrants, each of said words having at least one cell in each of said quadrants.

10. A memory device comprising:

an integrated circuit chip having a first side and a second side, said second side being parallel to said first side;

an array of memory cells arranged in blocks, said blocks being arranged in first, second, third and fourth quadrants, said first quadrant and second quadrants being adjacent to said first side, said third and fourth quadrants being adjacent to said second side;

address inputs for receiving address codes for selecting respective sets of said cells, each of said sets containing all of said cells selected in response to a respective address code, each of said quadrants including at least one cell of each of said sets;

data ports for coupling said array to a host system external to said chip, said data ports being arranged in a first and a second series, said first series being arranged along said first side, said second series being arranged along said second side; and address decoding means for coupling said data ports to a selected one of said sets so that cells of said selected set in said first and second quadrants are coupled to data ports in said first series and so that cells of said selected set in said third and fourth quadrants are coupled to data ports in said second series.

* * * * *